United States Patent
Klingbeil et al.

(10) Patent No.: US 10,014,262 B2
(45) Date of Patent: Jul. 3, 2018

(54) METHOD OF WAFER DICING FOR BACKSIDE METALLIZATION

(71) Applicant: FREESCALE SEMICONDUCTOR, INC., Austin, TX (US)

(72) Inventors: L. Scott Klingbeil, Chandler, AZ (US); Colby Rampley, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/182,224

(22) Filed: Jun. 14, 2016

(65) Prior Publication Data

US 2017/0358537 A1    Dec. 14, 2017

(51) Int. Cl.
*H01L 23/544* (2006.01)
*H01L 21/683* (2006.01)
*H01L 21/78* (2006.01)

(52) U.S. Cl.
CPC ........ *H01L 23/544* (2013.01); *H01L 21/6836* (2013.01); *H01L 21/78* (2013.01); *H01L 2221/68327* (2013.01); *H01L 2223/5446* (2013.01)

(58) Field of Classification Search
CPC ... H01L 21/78; H01L 21/6836; H01L 23/544; H01L 2221/68327; H01L 2223/5446; B23K 26/006; B23K 26/0063; B23K 26/362; B23K 26/364; B23K 26/384; B23K 26/386
USPC ........................................................ 438/462
See application file for complete search history.

(56) References Cited

U.S. PATENT DOCUMENTS

| | | | | |
|---|---|---|---|---|
| 7,364,986 | B2 * | 4/2008 | Nagai | B23K 26/08 |
| | | | | 219/121.67 |
| 8,399,281 | B1 * | 3/2013 | Patterson | H01L 21/78 |
| | | | | 219/121.72 |
| 8,912,078 | B1 | 12/2014 | Lei et al. | |
| 2003/0102526 | A1 * | 6/2003 | Dias | H01L 23/3677 |
| | | | | 257/618 |
| 2014/0179084 | A1 * | 6/2014 | Lei | H01L 21/78 |
| | | | | 438/463 |
| 2015/0279740 | A1 * | 10/2015 | Roesner | H01L 21/76898 |
| | | | | 438/464 |

* cited by examiner

*Primary Examiner* — Yu Chen
*Assistant Examiner* — Scott Bauman

(57) ABSTRACT

Method embodiments of wafer dicing for backside metallization are provided. One method includes: applying dicing tape to a front side of a semiconductor wafer, wherein the front side of the semiconductor wafer includes active circuitry; cutting a back side of the semiconductor wafer, the back side opposite the front side, wherein the cutting forms a retrograde cavity in a street of the semiconductor wafer, the retrograde cavity has a gap width at the back side of the semiconductor wafer, and the retrograde cavity has sidewalls with negative slope; depositing a metal layer on the back side of the semiconductor wafer, wherein the gap width is large enough to prevent formation of the metal layer over the retrograde cavity; and cutting through the street of the semiconductor wafer subsequent to the depositing the metal layer.

8 Claims, 4 Drawing Sheets

METHOD OF WAFER DICING FOR BACKSIDE METALLIZATION

BACKGROUND

Field

This disclosure relates generally to semiconductor device fabrication, and more specifically, to methods of dicing semiconductor wafers where a wafer also receives backside metallization.

Related Art

Semiconductor device fabrication includes singulation of a semiconductor wafer into a plurality of semiconductor die. The plurality of semiconductor die are arranged on the semiconductor wafer with singulation lines, or streets, running in horizontal and vertical directions on the semiconductor wafer between the plurality of semiconductor die.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1A:
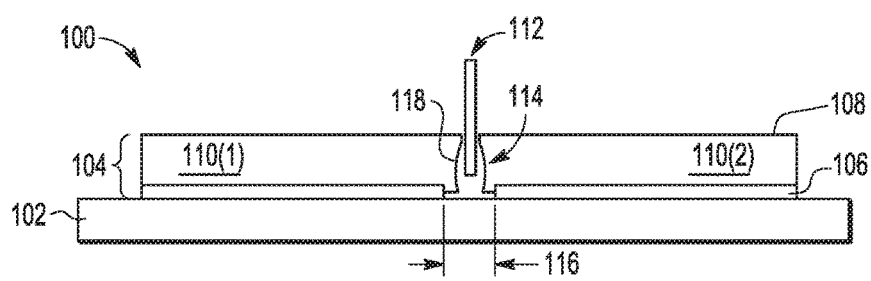
FIG. 1A-1D illustrate block diagrams depicting a semiconductor wafer after various steps of an example wafer dicing process in which the present disclosure is implemented, according to some embodiments.

The following sets forth a detailed description of various embodiments intended to be illustrative of the invention and should not be taken to be limiting.

Overview

Ultrathin substrates are presently being used for higher power devices, such as LDMOS (laterally diffused metal oxide semiconductor) transistors. A thick metal layer is applied to a back side of a semiconductor wafer instead of the larger package in order to reduce packaging costs. However, typical laser dicing that is compatible with the semiconductor wafer dicing process is incompatible with the addition of the thick metal layer. Lasers that are capable of cutting the thick metal layer are incompatible with the semiconductor wafer dicing process. Instead, a saw is used to singulate a wafer with a thick metal layer. However, the combination of a thick metal layer on a thin semiconductor wafer often results in chipped die, metal stringers, and other potential damage to the semiconductor die due to scrap metal fly-off during the dicing process. Similar problems have been seen when singulating a thicker substrate having a thick metal layer.

The present disclosure provides a wafer dicing process for backside metallization, which includes creating a retrograde cavity in a street between the die of the wafer before deposition of the thick metal layer on the back side of the wafer. The retrograde cavity can be formed using laser dicing or a rotating saw blade, or similar separation technique. The retrograde cavity forms a gap width between the die to prevent the formation of the thick metal layer between the die, which results in a less resistive final separation process since the full thick metal layer does not need to be cut between the die. The sidewalls of the retrograde cavity also have sufficient negative slope to prevent metal formation on the sidewalls. The retrograde cavity can extend partially through the wafer or fully through the wafer, depending on the die size, substrate or wafer thickness, and metal layer thickness. The final separation process can also be completed using laser dicing or a rotating saw blade, or similar separation technique.

Example Embodiments

FIG. 1A-1D illustrate block diagrams depicting a semiconductor wafer 104 after various steps of a wafer dicing process 100 of the present disclosure. Semiconductor wafer 104 has a front side 106 and a back side 108 that is opposite the front side 106. Semiconductor wafer 104 includes a plurality of die, such as die 110(1) and 110(2), arranged in rows and columns. The die are separated from one another by a street width 116 in both the row and column directions. Semiconductor wafer 104 also includes active circuitry located on the front side 106 for each of the plurality of die, where the active circuitry includes integrated circuit components that are active when the die is powered. Semiconductor wafer 104 has a width measured between the front side 106 and the back side 108, where a magnitude of the wafer width falls within a range of 15 to 360 microns. In some embodiments, the wafer width falls within a typical range of 75 to 125 microns. In some embodiments, semiconductor wafer 104 is processed and thinned prior to the wafer dicing process 100.

Semiconductor wafer 104 (also referred to as simply wafer 104) described herein can be any semiconductor material or combinations of materials, such as gallium arsenide, silicon germanium, silicon-on-insulator (SOI), silicon, monocrystalline silicon, the like, and combinations of the above. The active circuitry for the plurality of die on semiconductor wafer 104 is formed using a sequence of numerous process steps applied to semiconductor wafer 104, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device. In some embodiments, the active circuitry includes an LDMOS (laterally diffused metal oxide semiconductor) transistor.

As shown in FIG. 1A, dicing tape 102 is applied to the front side 106 of wafer 104 over the active circuitry. In some embodiments, dicing tape 102 includes an adhesive surface that adheres to the front side 106 of wafer 104. In some embodiments, dicing tape 102 is formed from a polymer film such as PVC (polyvinyl chloride), polyolefin, polyethylene, or similar material, where a die adhesive is placed on a surface of the polymer film. In some embodiments, the dicing tape 102 is removable in response to UV (ultraviolet light) exposure or temperature excursion (e.g., the die adhesive weakens in response to the UV exposure or temperature excursion). In some embodiments, dicing tape 102 includes a release layer to release the wafer or the resulting die from the dicing tape 102. In some embodiments, dicing tape 102 includes a reflective surface, as further discussed below in connection with FIG. 3-6.

Figure 1B:
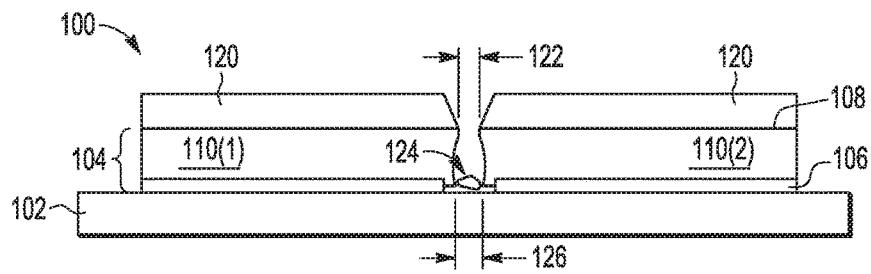

FIG. 1A illustrates a cutting step of wafer dicing process 100 from the back side 108 of wafer 104 using a cutting means 112, where the wafer 104 is oriented face down (i.e., the front side 106 is oriented in a downward direction). Cutting means 112 forms a retrograde cavity 114 within the street width 116, such as by forming an opening in the back side 108 of wafer 104 and removing a portion of the wafer 104 within the street width 116 to form sidewalls 118 of the retrograde cavity 114. As shown in FIG. 1B, this back side opening has a gap width 122, and forms a gap between die 110(1) and 110(2). Sidewalls 118 slope from the gap width 122 down toward the front side 106 of the wafer 104 and away from the center of the street width 116 at some retrograde angle, which is referred to as a negative slope. Stated another way, on either side of the street 116, a sidewall of die 110(1) is recessed into die 110(1) by the negative slope away from the center of the street, and an opposing sidewall of die 110(2) is similarly recessed into die 110(2) by the negative slope away from the center of the street. Examples of cutting means 112 are further discussed below in connection with FIG. 3-5. Another embodiment of a wafer dicing process uses a bevel saw as cutting means 112 and is discussed below in connection with 7A-7E.

FIG. 1B illustrates a completed metal layer deposition step, where a metal layer 120 is deposited on the back side 108 of wafer 104. Examples of metal layer deposition include but are not limited to sputtering, spin coating, chemical vapor deposition (CVD), physical vapor deposition (PVD), and conformal depositing. Metal layer 120 may include one or more conductive materials, such as gold, copper, aluminum, tungsten, and the like, having suitable conductive properties. Metal layer 120 has a thickness that falls within a range of 10 to 30 microns, such as a thickness of 20 microns, in some embodiments. Metal layer 120 may be referred to as a thick metal layer 120.

Figure 6A:
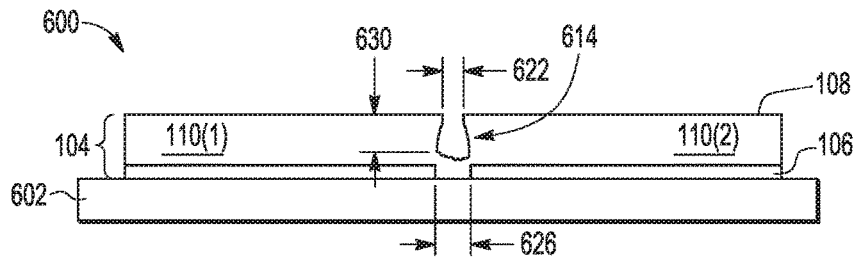
FIG. 6A-6B illustrate block diagrams depicting a semiconductor wafer after various steps of another example wafer dicing process in which the present disclosure is implemented, according to some embodiments.
Figure 6B:
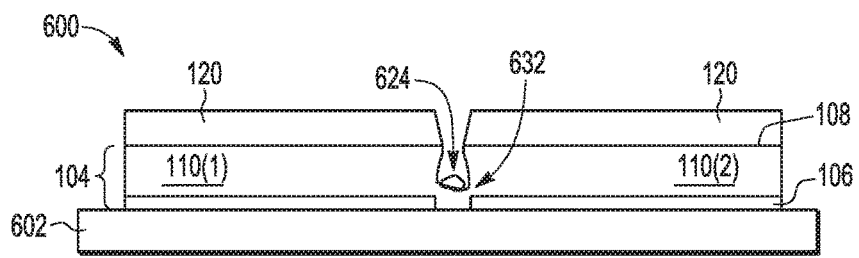

Retrograde cavity 114 has a width measured between opposing sidewalls 118 that generally widens as depth measured from the back side 108 of wafer 104 increases (e.g., has a substantially triangular cross-sectional profile). In the embodiment shown in FIG. 1A-1D, retrograde cavity 114 extends through wafer 104 entirely and has another opening that forms a bottom width 126 in the front side 106 of wafer 104. Bottom width 126 is larger than gap width 122 by an amount necessary to ensure that sidewalls 118 have a negative slope sufficient to prevent or at least minimize metal deposition on the sidewalls 118. In some embodiments, the magnitudes of gap width 122 and bottom width 126 are selected to ensure at least a 20 degree negative slope of the sidewalls of the retrograde cavity. In some embodiments, the magnitude of widths 122 and 126 are selected to ensure a negative slope having a retrograde angle falling within the range of 20 to 45 degrees. It is noted that different metals used during the metal layer deposition may each require a different negative slope to prevent metal deposition on the sidewalls of the retrograde cavity. Bottom width 126 also has a maximum limit equal to the street width 116. In some embodiments, a magnitude of street width 116 falls within a range of 60 to 300 microns, although the street width may be larger or smaller in other embodiments. In some embodiments, a magnitude of bottom width 126 is preferred to fall within a range of 20 to 100 microns. Another embodiment of the retrograde cavity is shown in FIG. 6A-6B, where the retrograde cavity does not extend through a portion of wafer 104 entirely, and instead a portion of wafer 104 remains under the retrograde cavity.

In some embodiments, gap width 122 should be large enough to prevent or at least minimize formation of metal layer 120 over the retrograde cavity 114 (e.g., metal layer 120 is non-continuous over gap width 622). Some of the metal deposited on the back side 108 of wafer 104 may fall through the gap width 122 and form a metal deposition 124 near the front side 106 of wafer 104. While the sidewalls 118 are preferred to have a negative slope continuously from the back side 108 to the front side 106, the sidewalls 118 may have a small positive slope near the bottom of the retrograde cavity 114 and slope back in towards the center of the street (e.g., has a substantially vase-like or diamond-shaped cross-sectional profile), depending on any abnormalities or defects that may occur during the cutting illustrated in FIG. 1A. As a result in such scenarios, the metal deposition 124 may be connected to the ends of the sidewalls 118 near the front side 106 of the wafer 104.

Figure 1C:
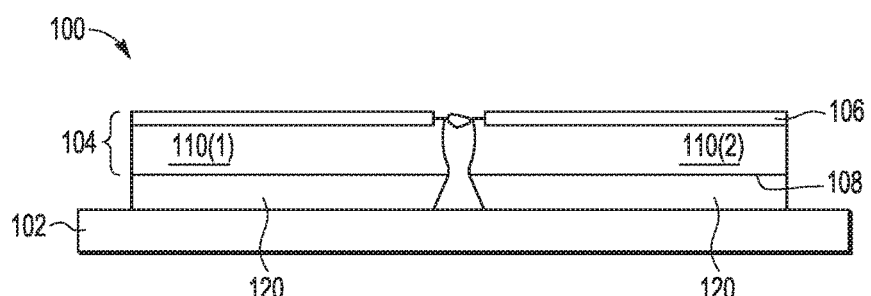

FIG. 1C illustrates a completed taping step of the wafer dicing process 100 that applies a dicing tape 102 to the back side 108 of the wafer over the metal layer 120 and removes the dicing tape 102 from the front side 106 of the wafer 104. The wafer 104 is flipped and oriented face up (i.e., the front side 106 is oriented in an upward direction). In some embodiments, the dicing tape 102 illustrated in FIG. 1C is the same type of dicing tape utilized in FIG. 1A. In other embodiments, the dicing tape 102 is a different type of dicing tape (e.g., the dicing tape utilized in FIG. 1A has a reflective surface, while the dicing tape utilized in FIG. 1C does not have a reflective surface).

Figure 1D:
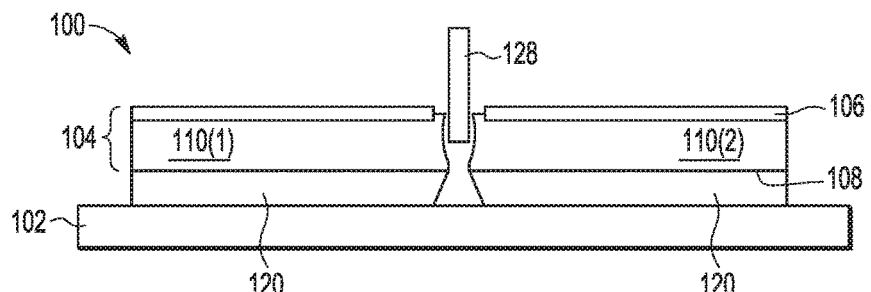

FIG. 1D illustrates a final cutting step of wafer dicing process 100 from the front side 106 of wafer 104 using a final cutting means 128. Final cutting means 128 is configured to cut through the center of the street to complete the wafer dicing process 100 and singulate the plurality of die from one another, including removal of any metal deposition 124 that may remain connected to the sidewalls 118. Examples of final cutting means 128 include but are not limited to a laser, a rotating saw, a bevel saw, and the like While the gap width 122 should be large enough to ensure that metal layer 120 is non-continuous over gap width 122, a thin portion of metal layer 120 may be formed over gap width 122, depending on any abnormalities or defects that may occur during the metal layer deposition illustrated in FIG. 1B. However, in such scenarios, the resulting thin portion of metal layer 120 should be much thinner than metal layer 120 (e.g., less than 5 microns) and is still easier for the final cutting means 128 to cut through, as compared with the full thickness of metal layer 120. In scenarios where the gap width 122 fully prevents metal layer 120 from being formed over gap width 122 and the retrograde cavity 114 fully extends from the back side 108 to the front side 106, no additional cutting step may be required (i.e., the final cutting step shown in FIG. 1D may be skipped).

Figure 2:
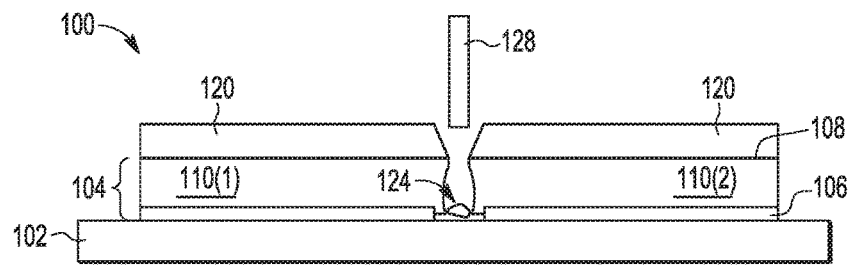
FIG. 2 illustrates a block diagram depicting a semiconductor wafer after a step of another example wafer dicing process in which the present disclosure is implemented, according to some embodiments.

FIG. 2 illustrates a block diagram depicting an alternative final cutting step implemented in another embodiment of wafer dicing process. This alternative embodiment of the wafer dicing process includes the cutting step of FIG. 1A, the metal layer deposition step of FIG. 1B, and the final cutting step illustrated in FIG. 2. As shown in FIG. 2, wafer 104 remains in a face down orientation on the same dicing tape utilized in FIG. 1B. The final cutting step is performed from the back side 108 of wafer 104 (rather than from the front side 106), which does not require flipping the wafer 104.

Figure 3:
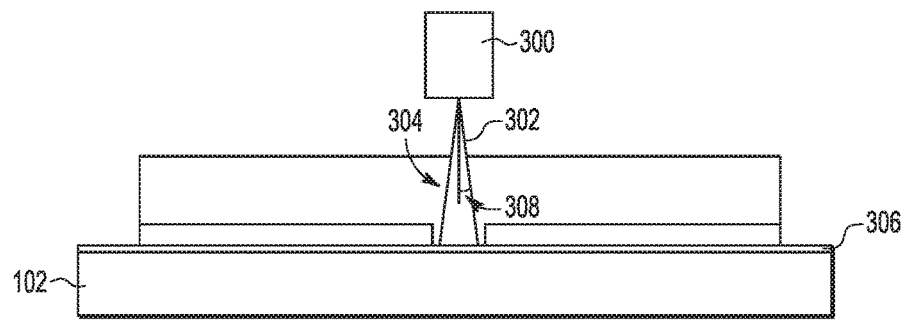
FIG. 3-5 illustrate block diagrams depicting example laser sources for wafer dicing in which the present disclosure is implemented, according to some embodiments.
Figure 4:
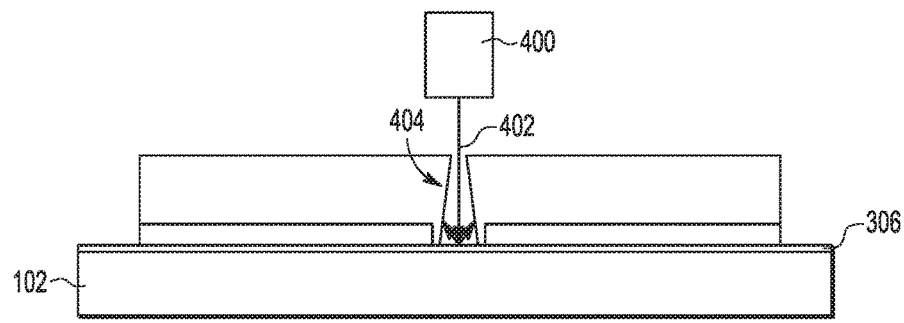
Figure 5:
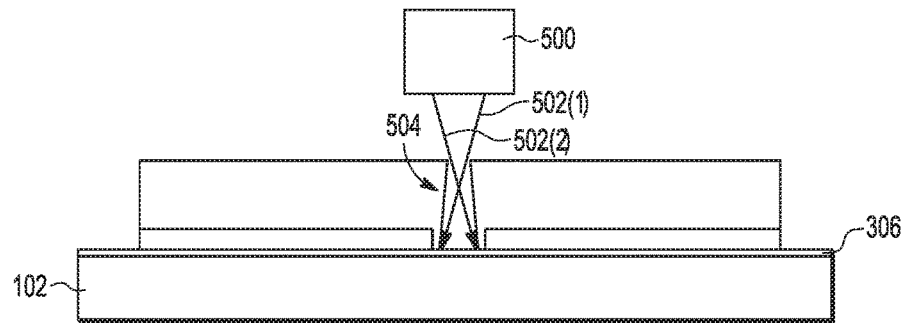

FIG. 3-5 illustrate block diagrams depicting example laser sources as cutting means 112 for wafer dicing according to the present disclosure. The laser sources discussed herein may utilize pulsed laser beams or continuous laser beams. Each of the laser cutting steps shown in FIG. 3-5 are performed from the back side 108 of the wafer 104 (i.e., the front side 106 of the wafer 104 is oriented in a downward direction). Each of the laser cutting steps shown in FIG. 3-5 are illustrated as forming a retrograde cavity through the entirety of the wafer 104, such as by forming a first opening (having the gap width) in the back side 108 of the wafer 104 and a second opening (having the bottom width) in the front side 106 of the wafer 104. The opening in the front side 106 is wider than the opening in the back side 108, and the sidewalls of the retrograde cavity slope negatively from the opening in the back side 108 to the opening in the front side 106. In other embodiments, the laser cutting steps shown in FIG. 3-5 form a retrograde cavity in the wafer 104, where a portion of the wafer 104 remains under the cavity, as discussed further below in connection with FIG. 6A-6B.

In some embodiments, it is beneficial to use a dicing tape 102 that has a reflective surface 306 that does not absorb laser wavelengths when utilizing one of the laser cutting steps illustrated in FIG. 3-5 to form a retrograde cavity through the entirety of the wafer 104. The reflective surface 306 reflects the laser beam(s) of the laser source back up and into the wafer 104 to efficiently remove a portion of the wafer 104 within the street and more efficiently form the negatively sloped sidewalls of the retrograde cavity. A dicing tape 102 that has a reflective surface 306 may be formed using a polymer film (as discussed above) embedded with a metallized foil film that acts as a reflector.

FIG. 3 illustrates a laser source 300 that provides dispersive laser ablation. Laser source 300 provides a laser beam that has a path 302 directed down over the center of the street width, where the laser beam path 302 widens or disperses as the laser beam travels farther away from laser source 300 and deeper into the wafer 104, forming sidewalls having negative slope. In some embodiments, the negative slope is created at a retrograde angle 308 of at least 20 degrees, as measured from the center of the beam out to the sidewalls. Over a period of time, laser beam path 302 forms an opening in the back side 108 of the wafer 104 and removes a portion of the wafer 104 within the street. Over an additional period of time, laser beam path 302 continues removing a portion of the wafer 104 and reaches the front side of the wafer 104, forming a wider opening in the front side 106 of the wafer 104.

FIG. 4 illustrates a laser source 400 that provides reflective laser ablation. Laser source 400 provides a laser beam that has a path 402 directed down over the center of the street width. The laser beam path 402 is also reflected upward off of the semiconductor material of the wafer 104 underneath the laser source 400 and into the surrounding portion of the wafer 104, forming sidewalls having negative slope. Over a period of time, laser beam path 402 forms an opening in the back side 108 of wafer 104 and removes a portion of the wafer 104 within the street. Over an additional period of time, laser beam path 402 continues removing a portion of the wafer 104 and reaches the front side of the wafer 104, forming a wider opening in the front side 106.

FIG. 5 illustrates a laser source 500 that provides dual laser ablation. Laser source 500 provides a pair of laser beams having paths 502(1) and 502(2) that are directed downward over the center of the street width, where the laser beam paths 502 cross one another over the center of the street width. Each of the pair of laser beams is targeted at an opposing outer edge of the retrograde cavity's targeted opening in the front side 106 of wafer 104. Each of the laser beam paths 502 may also be reflected upward off of the semiconductor material of the wafer 104 underneath the laser source 500 and into the surrounding portion of the wafer 104, forming sidewalls having a negative slope. Over a period of time, laser beam paths 502 form an opening in the back side 108 of the wafer 104 and removes a portion of the wafer 104 within the street. Over an additional period of time, laser beam paths 502 continue removing a portion of the wafer 104 and reach the front side of the wafer 104, forming a wider opening in the front side 106. It is noted that the angles of the laser beams 502(1)-(2) may be adjusted (e.g., raising or lowering the crossing point of the laser beam paths over the center of the street width), which controls the gap width of the opening in the back side 108, as well as the amount of negative slope of the sidewalls 504 of the retrograde cavity.

FIG. 6A-6B illustrate block diagrams depicting a semiconductor wafer 104 after various steps of another example wafer dicing process 600. A dicing carrier 602 is applied to the front side 106 of wafer 104 over the active circuitry. In some embodiments, dicing carrier 602 is a dicing tape, as similarly discussed above. In other embodiments, dicing carrier 602 is a glass mount, which may be used when the wafer 104 is thinner than 200 microns or the metal layer deposition step requires an elevated temperature (e.g., greater than 50 degrees Celsius). FIG. 6A illustrates a resulting retrograde cavity 614 formed within the street width after a cutting step of wafer dicing process 600 from the back side 108 using cutting means 112. Cutting means 112 forms an opening or gap width 622 in the back side 108 of the wafer 104 and removes a portion of the wafer 104 within the street width to form sidewalls of the retrograde cavity. Retrograde cavity 614 does not extend through the entirety of wafer 104, but instead extends to a depth 630 into the wafer 104, as measured from the back side 108. A portion 632 of the wafer 104 remains under the retrograde cavity 614 to form a bottom of the retrograde cavity 614, as also shown in FIG. 6B. A width 626 of the retrograde cavity is largest at the bottom of the retrograde cavity 614. The bottom width 626 is larger than the gap width 622, and has a maximum limit equal to the street width. The sidewalls of the retrograde cavity 614 negatively slope from the gap width 622 at the back side 108 to the bottom width 626 of the retrograde cavity 614.

FIG. 6B illustrates a completed metal layer deposition step, where a metal layer 120 is deposited on the back side 108 of wafer 104, as similarly discussed above. In some embodiments, gap width 622 should be large enough to prevent formation of metal layer 120 over the retrograde cavity 614 (e.g., metal layer 120 is non-continuous over gap width 622). Some of the metal deposited on the back side 108 of wafer 104 may fall through gap width 122 and form a metal deposition 624 on the bottom of the retrograde cavity 614 over the remaining portion 632 of wafer 104. The metal deposition 624 and the remaining portion 632 of wafer 104 are subsequently removed during a final cutting step of process 600. Also, any remaining thin portion of metal layer 120 that may be inadvertently formed over gap width 622 is removed during the final cutting step of process 600.

In some embodiments, wafer dicing process 600 continues to a final cutting step like that shown in FIG. 2, where the final cutting step is performed from the back side 108 of wafer 104, with the wafer 104 oriented face down. In other embodiments, wafer dicing process 600 continues to a taping step like that shown in FIG. 10 that flips the wafer 104 to be oriented face up and then to a final cutting step like that illustrated in FIG. 10 that is performed from the front side 106 of wafer 104.

Figure 7A:
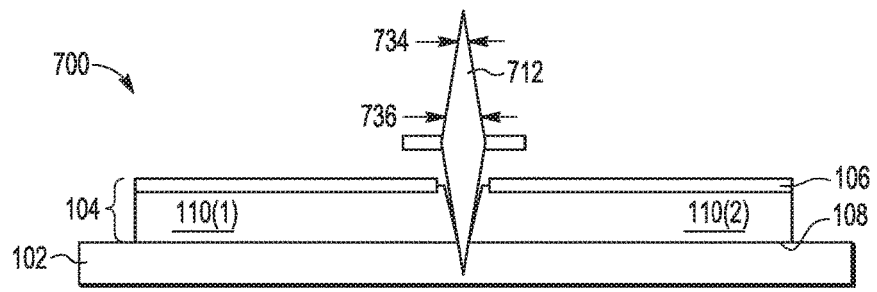
FIG. 7A-7E illustrate block diagrams depicting a semiconductor wafer after various steps of another example wafer dicing process in which the present disclosure is implemented, according to some embodiments.

FIG. 7A-7E illustrate block diagrams depicting a semiconductor wafer 104 after various steps of another example wafer dicing process 700 that implements a bevel saw 712 as cutting means 112. As shown in FIG. 7A, a dicing tape 102 (like that discussed above) is applied to the back side 108 of wafer 104. Wafer 104 is oriented face up. Bevel saw 712 has a saw blade that is widest at a center of the (circular) blade and thinnest at an outer edge of the blade. In some embodiments, the width of the saw blade falls within a range of 20 to 60 microns. In some embodiments, the saw blade of bevel saw 712 has a width 736 near a center of the blade of 30 microns and a width 734 near an edge of the blade of 25 microns. The magnitudes of the saw blade widths are selected to ensure at least a 20 degree negative slope of the sidewalls of the retrograde cavity. In some embodiments, the magnitude of the saw blade widths are selected to ensure a negative slope falling within the range of 20 to 45 degrees.

Figure 7B:
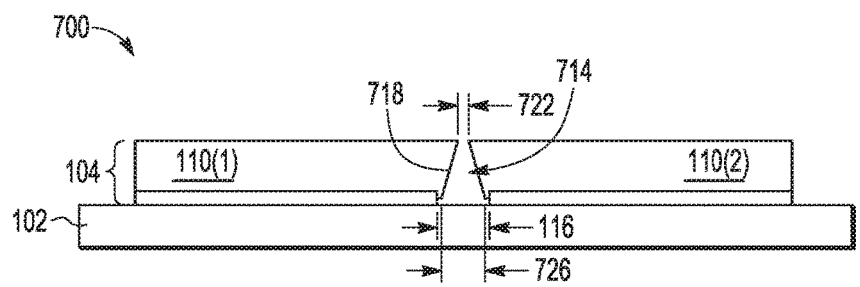

FIG. 7A illustrates a cutting step of wafer dicing process 700 using bevel saw 712, which is inserted into the front side 106 over a center of the street width to remove a portion of the wafer 104 within the street width and form retrograde cavity 714. Bevel saw 712 is inserted to a depth under wafer 104 that ensures the bevel saw blade reaches across the wafer 104. At such depth, the bevel saw blade has width 734 at the back side 108 of the wafer 104, which corresponds to the gap width 722 of retrograde cavity 714, as shown in FIG. 7B. Similarly, the bevel saw blade has width 736 at the front side 106 of the wafer 104, which corresponds to the bottom width 726 of the retrograde cavity 714, also shown in FIG. 7B. The bottom width 726 is larger than gap width 722, where sidewalls 718 of retrograde 714 slope negative from the gap width 722 to the bottom width 726.

FIG. 7B illustrates a completed taping step of the wafer dicing process 700 that applies a dicing tape 102 to the front side 106 of the wafer over the active circuitry and removes the dicing tape 102 from the back side 108 of the wafer 104. The dicing tape 102 applied to the front side 106 may be a same type or a different type than the dicing tape 102 applied to the back side 108 of the wafer 104. The wafer 104 is flipped and oriented face down.

Figure 7C:
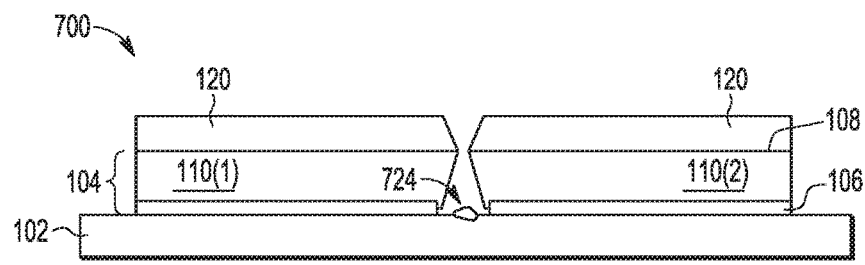

FIG. 7C illustrates a completed metal layer deposition step, where metal layer 120 is deposited on the back side 108 of wafer 104, as similarly discussed above in connection with FIG. 1B. A metal deposition 724 may be formed near the front side 106 of the wafer 104. It is noted that different metals used during the metal layer deposition may each require a different negative slope to prevent metal deposition on the sidewalls of the retrograde cavity.

Figure 7D:
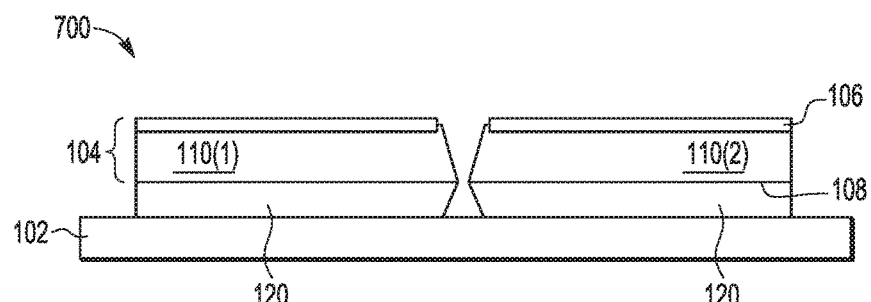

FIG. 7D illustrates a completed subsequent taping step of the wafer dicing process 700 that applies a dicing tape 102 to the back side 108 of the wafer 104 over the metal layer 120 and removes the dicing tape 102 from the front side 106 of the wafer 104. The dicing tape 102 applied to the back side 108 in FIG. 7D may be a same type or a different type than the dicing tape 102 applied to the back side 108 in FIG. 7A and the dicing tape 102 applied to the front side 106 of FIG. 7B. The wafer 104 is flipped and oriented face up.

Figure 7E:
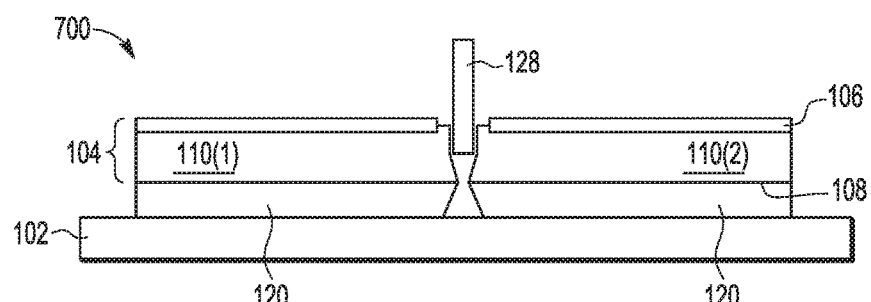

FIG. 7E illustrates a final cutting step of the wafer dicing process 700 from the front side 106 of wafer 104 using final cutting means 128. Final cutting means 128 is configured to cut through the center of the street to complete the wafer dicing process 700 and singulate the plurality of die from one another, including removal of any metal deposition 724 that may remain connected to sidewalls 718.

An alternative embodiment of the wafer dicing process 700 includes the cutting step of FIG. 7A, the taping step of FIG. 7B, the metal layer deposition step of FIG. 7C, and the final cutting step illustrated in FIG. 2. As shown in FIG. 2, wafer 104 remains in a face down orientation and the final cutting step is performed from the back side 108 of wafer 104 (rather than the front side 106), without requiring the wafer 104 to be flipped.

By now it should be appreciated that there has been provided a wafer dicing process for backside metallization, which includes creating a retrograde cavity in a street between the die of the wafer before deposition of the thick metal layer on the back side of the wafer. The retrograde cavity forms a gap width between the die to prevent the formation of the thick metal layer between the die, which results in a less resistive final separation process since the full thick metal layer does not need to be cut between the die. The sidewalls of the retrograde cavity also have sufficient negative slope to prevent metal formation on the sidewalls.

In one embodiment of the present disclosure, a method of wafer dicing for backside metallization is provided, the method including: applying dicing tape to a front side of a semiconductor wafer, wherein the front side of the semiconductor wafer includes active circuitry; cutting a back side of the semiconductor wafer, the back side opposite the front side, wherein the cutting forms a retrograde cavity in a street of the semiconductor wafer, the retrograde cavity has a gap width at the back side of the semiconductor wafer, and the retrograde cavity has sidewalls with negative slope; depositing a metal layer on the back side of the semiconductor wafer, wherein the gap width is large enough to prevent formation of the metal layer over the retrograde cavity; and cutting through the street of the semiconductor wafer subsequent to the depositing the metal layer.

One aspect of the above embodiment provides that the negative slope prevents formation of the metal layer on the sidewalls of the retrograde cavity.

Another aspect of the above embodiment provides that the cutting through the street is performed from the back side of the semiconductor wafer.

Another aspect of the above embodiment provides that the method further includes: applying dicing tape to the back side of the semiconductor wafer over the metal layer and flipping the semiconductor wafer, prior to the cutting through the street, wherein the cutting through the street is performed from the front side of the semiconductor wafer.

Another aspect of the above embodiment provides that the retrograde cavity extends from the back side of the semiconductor wafer through the front side of the semiconductor wafer, and a width of the retrograde cavity at the front side of the semiconductor wafer is larger than the gap width of the retrograde cavity at the back side of the semiconductor wafer.

Another aspect of the above embodiment provides that the retrograde cavity extends from the back side of the semiconductor wafer to a depth, leaving a portion of the semiconductor wafer under the retrograde cavity to form a bottom of the retrograde cavity, and a width of the retrograde cavity at the bottom of the cavity is larger than the gap width of the retrograde cavity at the back side of the semiconductor wafer.

A further aspect of the above embodiment provides that the cutting through the street includes cutting through the portion of the semiconductor wafer under the retrograde cavity.

Another aspect of the above embodiment provides that the sidewalls of the retrograde cavity have negative slope of at least 20 degrees.

Another aspect of the above embodiment provides that the cutting the back side is performed utilizing one of a group of ablation techniques including: dispersive laser ablation, reflective laser ablation, and dual laser ablation.

A further aspect of the above embodiment provides that the dicing tape has a reflective surface utilized by the one ablation technique to form the sidewalls with negative slope.

In another embodiment of the present disclosure, a method of wafer dicing for backside metallization is provided, the method including: applying a glass mount to a front side of a semiconductor wafer, wherein the front side of the semiconductor wafer includes active circuitry; cutting a back side of the semiconductor wafer, the back side opposite the front side, wherein the cutting forms a retrograde cavity in a street of the semiconductor wafer, the retrograde cavity has a gap width at the back side of the semiconductor wafer, the retrograde cavity has a depth into the semiconductor wafer, a portion of the semiconductor wafer remains under the cavity and forms a bottom of the cavity, and the retrograde cavity has sidewalls with negative slope; depositing a metal layer on the back side of the semiconductor wafer, wherein the gap width is large enough to prevent formation of the metal layer over the retrograde cavity; and cutting through the portion of the semiconductor wafer under the retrograde cavity subsequent to the depositing the metal layer.

One aspect of the above embodiment provides that the negative slope prevents formation of the metal layer on the sidewalls of the retrograde cavity.

Another aspect of the above embodiment provides that the cutting through the portion of the semiconductor wafer is performed from the back side of the semiconductor wafer.

Another aspect of the above embodiment provides that the method further includes: applying dicing tape to the back side of the semiconductor wafer over the metal layer and flipping the semiconductor wafer, prior to the cutting through the portion of the semiconductor wafer, wherein the cutting through the portion of the semiconductor wafer is performed from the front side of the semiconductor wafer.

Another aspect of the above embodiment provides that a width of the retrograde cavity at the bottom of the cavity is larger than the gap width of the retrograde cavity at the back side of the semiconductor wafer.

In another embodiment of the present disclosure, a method of wafer dicing for backside metallization is provided, the method including: applying a first dicing tape to a back side of a semiconductor wafer, wherein the back side is opposite a front side of the semiconductor wafer that includes active circuitry; cutting the front side of the semiconductor wafer with a bevel saw, wherein the cutting forms a retrograde cavity in a street of the semiconductor wafer, the retrograde cavity has a gap width at a back side of the semiconductor wafer, and the retrograde cavity has sidewalls with negative slope; applying a second dicing tape to the front side of the semiconductor wafer and flipping the semiconductor wafer; depositing a metal layer on the back side of the semiconductor wafer, wherein the gap width is large enough to prevent formation of the metal layer over the retrograde cavity; and cutting through the street of the semiconductor wafer subsequent to the depositing the metal layer.

One aspect of the above embodiment provides that the negative slope prevents formation of the metal layer on the sidewalls of the retrograde cavity.

Another aspect of the above embodiment provides that the cutting through the street is performed from the back side of the semiconductor wafer.

Another aspect of the above embodiment provides that the method further includes: applying a third dicing tape to the back side of the semiconductor wafer over the metal layer and flipping the semiconductor wafer, prior to the cutting through the street, wherein the cutting through the street is performed from the front side of the semiconductor wafer.

Another aspect of the above embodiment provides that the bevel saw reaches a predetermined depth into the semiconductor wafer to form the retrograde cavity, the bevel saw has a first width at the back side of the semiconductor wafer to form the gap width of the retrograde cavity and a second width at the front side of the semiconductor wafer to form a width of the retrograde cavity at the front side, and the second width is wider than the first width.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose. Also as used herein, the terms "approximately" and "about" mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. For example, the various dimensions of the retrograde cavity shown in the Figures are adjustable to take into account. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of wafer dicing for backside metallization, the method comprising:
    applying dicing tape to a front side of a semiconductor wafer, wherein the front side of the semiconductor wafer comprises active circuitry;
    cutting a back side of the semiconductor wafer, the back side opposite the front side, wherein the cutting forms a retrograde cavity in a street of the semiconductor wafer, the retrograde cavity has a gap width at the back side of the semiconductor wafer, and the retrograde cavity has sidewalls with negative slope;
    depositing a metal layer on the back side of the semiconductor wafer subsequent to the cutting the back side, wherein the gap width is large enough to prevent formation of the metal layer over the retrograde cavity, and wherein the negative slope prevents formation of the metal layer on the sidewalls of the retrograde cavity; and
    cutting through the street of the semiconductor wafer subsequent to the depositing the metal layer.

2. The method of claim 1, wherein the cutting through the street is performed from the back side of the semiconductor wafer.

3. The method of claim 1, wherein
    the retrograde cavity extends from the back side of the semiconductor wafer through the front side of the semiconductor wafer, and
    a width of the retrograde cavity at the front side of the semiconductor wafer is larger than the gap width of the retrograde cavity at the back side of the semiconductor wafer.

4. The method of claim 1, wherein
    the retrograde cavity extends from the back side of the semiconductor wafer to a depth, leaving a portion of the semiconductor wafer under the retrograde cavity to form a bottom of the retrograde cavity, and
    a width of the retrograde cavity at the bottom of the cavity is larger than the gap width of the retrograde cavity at the back side of the semiconductor wafer.

5. The method of claim 4, wherein the cutting through the street comprises cutting through the portion of the semiconductor wafer under the retrograde cavity.

6. The method of claim 1, wherein the sidewalls of the retrograde cavity have negative slope of at least 20 degrees.

7. The method of claim 1, wherein the cutting the back side is performed utilizing one of a group of ablation techniques including: dispersive laser ablation, reflective laser ablation, and dual laser ablation.

8. The method of claim 7, wherein the dicing tape has a reflective surface utilized by the one ablation technique to form the sidewalls with negative slope.

* * * * *